United States Patent
Cho et al.

(10) Patent No.: US 7,279,741 B2
(45) Date of Patent: Oct. 9, 2007

(54) SEMICONDUCTOR DEVICE WITH INCREASED EFFECTIVE CHANNEL LENGTH AND METHOD OF MANUFACTURING THE SAME

(75) Inventors: Chang-Hyun Cho, Kyungki-do (KR); Soo-Ho Shin, Kyungki-do (KR); Yong-Gyu Choi, Kyungki-do (KR); Tae-Young Chung, Kyungki-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 156 days.

(21) Appl. No.: 10/845,688

(22) Filed: May 13, 2004

(65) Prior Publication Data

US 2004/0235252 A1 Nov. 25, 2004

(30) Foreign Application Priority Data

May 23, 2003 (KR) ...................... 10-2003-0032884

(51) Int. Cl.
*H01L 29/76* (2006.01)
(52) U.S. Cl. ....................... 257/327; 257/344
(58) Field of Classification Search ................ 257/327, 257/344
See application file for complete search history.

(56) References Cited

U.S. PATENT DOCUMENTS

| 4,951,100 A | * | 8/1990 | Parrillo ........................ 257/344 |
| 5,491,099 A | * | 2/1996 | Hsu ............................. 438/302 |
| 5,847,428 A | * | 12/1998 | Fulford et al. ............... 257/344 |
| 5,874,343 A | * | 2/1999 | Fulford et al. ............... 438/305 |
| 6,551,870 B1 | * | 4/2003 | Ling et al. ................... 438/217 |

FOREIGN PATENT DOCUMENTS

| KR | 1020010002286 | 1/2001 |
| KR | 010015244 | 2/2001 |
| KR | 1020010059856 | 7/2001 |

OTHER PUBLICATIONS

English language abstract of Korean Publication No. 010015244.
English language abstract of Korean Publication No. 1020010059856.
English language abstract of Korean Publication No. 1020010002286.
Hamamoto, et al. "On the Retention Time Distribution of Dynamic Random Access Memory (DRAM)" IEEE transactions on electron devices, vol. 45, No. 6, Jun. 1998. pp. 1300-1309.

* cited by examiner

*Primary Examiner*—Douglas M. Menz
(74) *Attorney, Agent, or Firm*—Marger Johnson & McCollom, P.C.

(57) ABSTRACT

A semiconductor device with an increased effective channel length and a method of manufacturing the same. The device includes a semiconductor substrate, a gate insulating layer disposed on the semiconductor substrate, a gate electrode structure disposed on a predetermined portion of the gate insulating layer, an insulating layer for preventing short channel disposed on the surface of the resultant structure where the gate electrode structure is disposed, and a source region and a drain region disposed in the semiconductor substrate on either side of the gate electrode structure. Both the source region and the drain region are spaced apart from the gate electrode structure by the thickness of the insulating layer. The channel length of a MOS transistor can be thereby increased.

21 Claims, 3 Drawing Sheets

SEMICONDUCTOR DEVICE WITH INCREASED EFFECTIVE CHANNEL LENGTH AND METHOD OF MANUFACTURING THE SAME

This application claims the priority of Korean Patent Application No. 2003-32884, filed on May 23, 2003, in the Korean Intellectual Property Office, the disclosure of which is incorporated herein in its entirety by reference.

BACKGROUND OF THE INVENTION

1. Field of the Invention

The present invention relates to a semiconductor device and a method of manufacturing the same. More particularly, the present invention relates to a semiconductor device with an increased effective channel length and a method of manufacturing the same.

2. Description of the Related Art

The integration density of semiconductor devices continues to increase. The dimensions of devices have decreased to such an extent that at the present time, design rules in the neighborhood of 0.1 μm are possible.

When design rules are decreased, the line width and the channel length of gate electrodes of MOS transistors are scaled down. As a result, short channel effects (SCEs) can occur in the transistors.

The SCEs, result in threshold voltage being lowered and drain current being increased in the MOS transistors affected by channel length modulation. Furthermore there can be velocity saturation, drain induced boundary lowering (DIBL), and the likes.

If threshold voltage is lowered due to the SCEs, DRAM devices suffer degradation in their dynamic refresh characteristics. If ions for modulating threshold voltage are heavily doped to solve this problem, static refresh characteristics are degraded. Such problems are described in detail in the publication by Hamamoto, in "On the Retention Time Distribution of Dynamic Random Access Memory (1998, IEEE, Vol. 45, pp1300-1309)."

To solve SCEs, there are several known techniques for increasing the effective channel length and the line width of gate electrodes. An example of such techniques is disclosed in Korean Patent Application No. 2001-0015244. The technique described in the above referenced patent application results in the formation of a groove in the bottom of the gate electrode.

FIG. 1 relates to the technique described in the above referenced Patent application. With this technique a nitride pattern 12 is formed on a semiconductor substrate 10 where an isolation layer (not shown) is formed, so as to expose a channel formation region of a MOS transistor. Here, the channel formation region of the MOS transistor, i.e., a gate electrode formation region, has a line width of about 0.1 μm, and two portions of the nitride pattern 12 are spaced apart by about 0.1 μm. Insulating spacers 14 are formed on both sidewalls of the nitride pattern 12. The exposed semiconductor substrate 10 is oxidized by local thermal oxidation to form a thermal oxide layer 16.

As shown in FIG. 1B, the thermal oxide layer 16 and the insulating spacers 14 are removed by a wet etch process, thereby forming a recess 18 in the semiconductor substrate 10. Next, a gate insulating layer 22 is formed on the resultant structure of the semiconductor substrate 10 to a predetermined thickness, and a polysilicon layer is deposited on the gate insulating layer 22 so as to sufficiently fill the recess 18. The polysilicon layer 24 is removed using chemical mechanical polishing (CMP) until the nitride pattern 12 is exposed, thereby forming a gate electrode 24.

Referring to FIG. 1C, the nitride pattern 12 on both sides of the gate electrode 24 is removed, and low-concentration impurity ions are implanted into the exposed semiconductor substrate 10, thereby forming a lightly doped region (or an LDD region) 26. Thereafter, sidewall spacers 28 are formed on the both sidewalls of the gate electrode 24 by a known method, and high-concentration impurity ions are implanted into the both sidewall spacers 28, thereby forming a heavily doped region 30. Since the bottom of the gate electrode 24 is formed to be convex due to the recess 18, the channel length can be compensated.

However, the above described method of manufacturing a gate electrode of a MOS transistor requires a number of complicated processes, such as the formation of the nitride pattern 12, the formation of the spacers 14, the formation and removal of the thermal oxide layer 16, the filling of the gate electrode 24, and the like.

Also, the thermal oxide layer 16 obtained by the local thermal oxidation may get stressed due to the adjacent nitride pattern 12. Further, since a bird's beak may occur at both edges of the thermal oxide layer 16, forming the recess 18 in the desired shape is very difficult.

SUMMARY OF THE INVENTION

In accordance with an aspect of the present invention, there is provided a semiconductor device comprising a gate insulating layer disposed on a semiconductor substrate. A gate electrode structure is disposed on a predetermined portion of the gate insulating layer. An insulating layer for preventing short channel is disposed on the surface of the resultant structure where the gate electrode structure is disposed, and a source region and a drain region are disposed in the semiconductor substrate on sides of the gate electrode structure. Both the source region and the drain region are spaced apart from the gate electrode structure by the thickness of the insulating layer. This prevents short channel. Preferably, the insulating layer for preventing short channel has a thickness of about 50 Å to 100 Å.

In accordance with another aspect of the present invention, there is provided a semiconductor device comprising a gate insulating layer disposed on a semiconductor substrate. A gate electrode structure is disposed on a predetermined portion of the gate insulating layer and includes at least one conductive layer. A re-oxidation (GPOX) layer is disposed on the sidewalls of the conductive layer of the gate electrode structure, and an insulating layer for preventing short channel is disposed on the resultant structure where the GPOX layer and the gate electrode structure are disposed. Spacers are disposed on the surface of the insulating layer to prevent short channel. A source region and a drain region are disposed in the semiconductor substrate on the sides of the gate electrode structure. Both the source region and the drain region are spaced apart from the gate electrode structure by the sum of the thicknesses of the insulating layer for preventing short channel and the GPOX layer, and, preferably, the insulating layer for preventing short channel has a thickness of about 50 Å to 100 Å.

An isolation layer is disposed in the semiconductor substrate to define an active region, and a well region and an ion region for modulating threshold voltage are disposed within the active region.

The gate electrode structure comprises a doped polysilicon layer disposed on the gate insulating layer, a transition metal silicide layer disposed on the doped polysilicon layer, and a hard mask layer disposed on the transition metal silicide layer.

Preferably, the insulating layer for preventing short channel is a silicon oxide layer, and the spacers and the hard mask layer are silicon nitride layers. Thus, the conductive layers constituting the gate electrode structure are surrounded by an insulating stack structure formed of oxide and nitride.

Also, the GPOX layer may have a thickness of about 40 Å to 60 Å, and the source and drain regions may be LDD structures including a lightly doped region and a heavily doped region.

In accordance with still another aspect of the present invention, there is provided a method of manufacturing a semiconductor device comprising forming a gate insulating layer on a semiconductor substrate and forming a gate electrode structure on a predetermined portion of the gate insulating layer. Thereafter, an insulating layer for preventing short channel is conformally formed to a thickness of about 50 Å to 100 Å on the surface of the semiconductor substrate where the gate electrode structure is formed. Then, a source region and a drain region are formed in the semiconductor substrate on sides of the gate electrode structure.

In accordance with yet another aspect of the present invention, there is provided a method of manufacturing a semiconductor device comprising forming a gate insulating layer on a semiconductor substrate and forming a gate electrode structure on a predetermined portion of the gate insulating layer. Thereafter, the surface of the semiconductor substrate including the gate electrode structure is thermally oxidized to form a GPOX layer, and an insulating layer for preventing short channel is conformally formed to a thickness of about 50 Å to 100 Å on the surface of the semiconductor substrate where the gate electrode structure is formed. Next, low-concentration impurity ions are implanted into the semiconductor substrate on sides of the insulating layer for preventing short channel disposed on the sidewalls of the gate electrode structure, and spacers are formed on the surface of the insulating layer for preventing short channel disposed on the sidewalls of the gate electrode structure. Thereafter, high-concentration impurity ions are implanted into the semiconductor substrate on sides of the spacers, and the lightly doped impurity ions and the heavily doped impurity ions are activated, thereby eventually forming a source region and a drain region.

Before the gate insulating layer is formed on the semiconductor substrate, the method of the present invention may further comprise forming an isolation layer in a predetermined portion of the semiconductor substrate; implanting well formation ions into a deep portion of the semiconductor substrate; and implanting ions for modulating threshold voltage into the surface of the semiconductor substrate.

The formation of the gate electrode structure may comprise depositing a doped polysilicon layer on the gate insulating layer; depositing a transition metal silicide layer on the doped polysilicon layer; forming a hard mask layer on the transition metal silicide layer; and patterning predetermined portions of the hard mask layer, the transition metal silicide layer, and the doped polysilicon layer.

The GPOX layer can be obtained from a thermal oxidation performed at a temperature of about 800° C. to 900° C. Also, the insulating layer for preventing short channel can be formed using chemical vapor deposition (CVD) at a temperature of about 720° C. to 820° C.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1A:
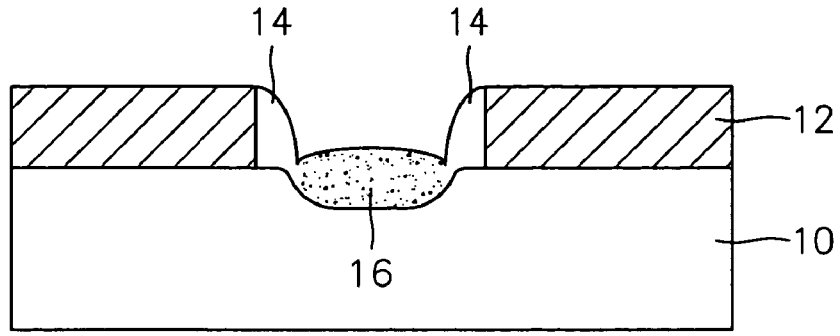
FIGS. 1A through 1C are cross-sectional views illustrating a conventional method of manufacturing a semiconductor device.
Figure 1B:
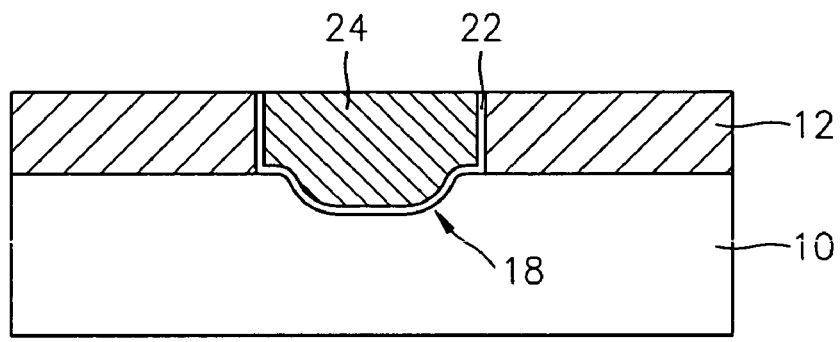
Figure 1C:
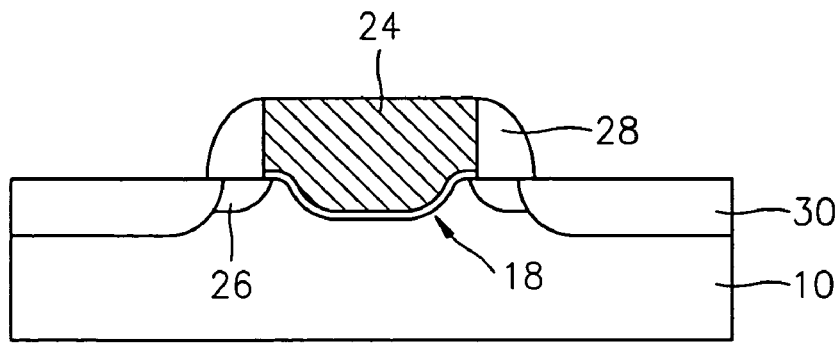

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure is thorough and complete and fully conveys the concept of the invention to those skilled in the art. In the drawings, the thicknesses of layers may be exaggerated for clarity, and the same reference numerals are used to denote the same elements throughout the drawings.

Figure 2A:
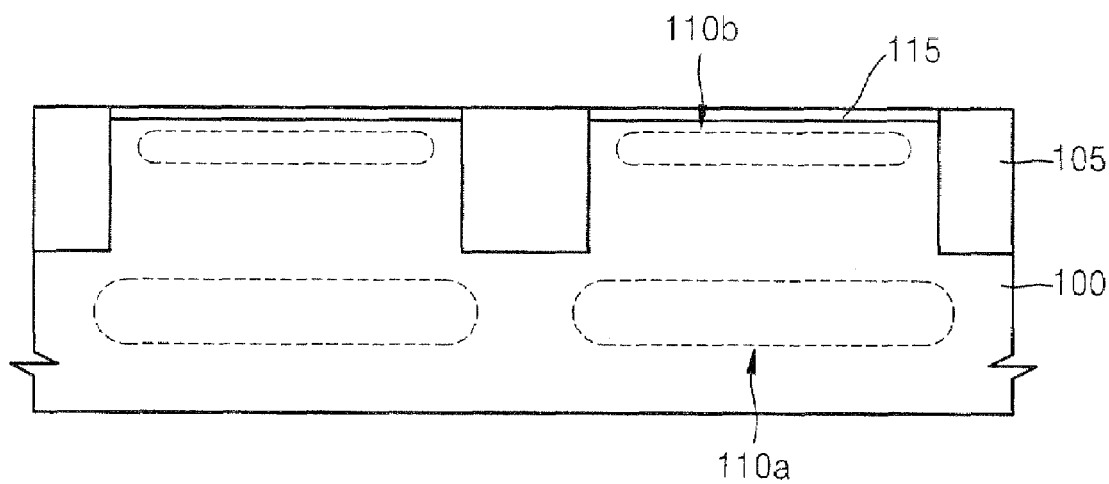
FIGS. 2A through 2D are cross-sectional views illustrating a method of manufacturing a semiconductor memory device according to an embodiment of the present invention.

Referring to FIG. 2A, an isolation region 105 is formed by, for example, a shallow trench isolation (STI) technique in a predetermined portion of a semiconductor substrate 100 so as to define an active region. A sacrificial oxide layer (not shown) is formed on the surface of the semiconductor substrate 100 where the isolation region 105 is formed, and well formation ions 110a are implanted into the semiconductor substrate 100. To form a p-type well boron (B) ions are implanted at an energy of about 350 KeV to about 450 KeV and at a dose of about $1 \times 10^{13}$ ions/cm$^2$ to $3 \times 10^{13}$ ions/cm$^2$. To form an n-type well, phosphorus (P) ions are implanted at an energy of about 750 KeV to about 850 KeV and at a dose of about $1 \times 10^{13}$ ions/cm$^2$. Thereafter, ions 110b for modulating threshold voltage are implanted into the surface of the semiconductor substrate 100. Generally, in a cell transistor (or an NMOS transistor), boron (B) ions or boron fluoride (BF$_2$) ions may be implanted as the ions 110b for modulating threshold voltage. Boron ions may be implanted at an energy of about 25 KeV to about 35 KeV and at a dose of about $3 \times 10^{12}$ ions/cm$^2$ to about $5 \times 10^{12}$ ions/cm$^2$, and boron fluorine ions may be implanted at an energy of about 30 KeV to about 60 KeV and at a dose of about $1 \times 10^{13}$ ions/cm$^2$. Then, the sacrificial oxide layer formed on the surface of the semiconductor substrate 100 is removed by a known method. The surface of the semiconductor substrate 100 is thermally oxidized, thereby forming a gate insulating layer 115 of about 40 Å to about 60 Å thick.

Figure 2B:
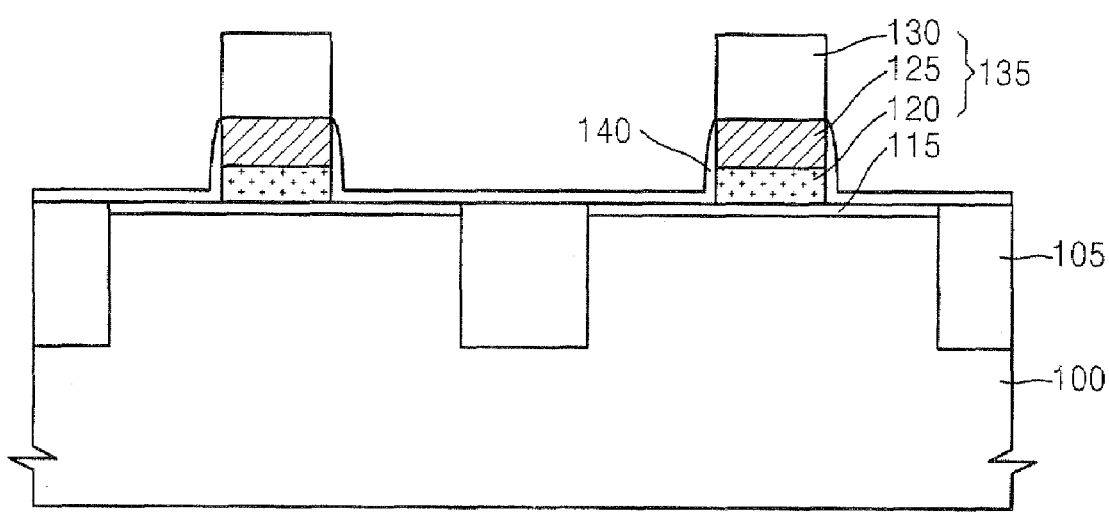

Referring to FIG. 2B, a doped polysilicon layer 120 and a transition metal silicide layer 125 are deposited on the gate insulating layer 115 to form a conductive layer for a gate electrode, and a hard mask layer 130 is deposited on the transition metal silicide layer 125. Here, each of the doped polysilicon layer 120 and the transition metal silicide layer 125 may be formed to a thickness of, for example, about 800 Å to about 1200 Å, and the transition metal silicide layer 125 can be formed using a tungsten silicide layer. Also, the hard mask layer 130 can be formed using, for example, a silicon nitride layer to a thickness of about 1800 Å to about 2200 Å. Thereafter, predetermined portions of the hard mask layer 130, the transition metal silicide layer 125, and the doped polysilicon layer 120 are etched by, for example, an anisotropic etch process using a plasma. Subsequently, a thermal oxidation is carried out at a temperature of about 800° C. to about 900° C. in order to cure damage to the surface of the semiconductor substrate 100 and the sidewalls of the gate electrode 135, caused by the anisotropic etch process using a plasma. Thus, a gate poly oxide (GPOX) layer 140 is formed on a portion of the sidewalls of the gate electrode structure 135 and the surface of the semiconductor substrate 100. Such a GPOX layer 140 is called a re-oxidation layer and can be formed to a thickness of about 40 Å to about 60 Å on the surface of the resultant structure where oxidation occurs, e.g., the surface of the gate insulating layer 115, the sidewalls of the doped polysilicon layer 120, and the sidewalls of the transition metal silicide layer 125. Thereafter, to reduce the resistance of the gate electrode structure 135, a rapid thermal annealing (RTA) may be carried out. Here, the well formation ions 110a and the ions 110b for modulating threshold voltage are activated due to the GPOX layer 140 formation process and/or the RTA process. Therefore, boundaries of the well formation ions 110a and the ions 110b for modulating threshold voltage are not shown in FIG. 2B.

Figure 2C:
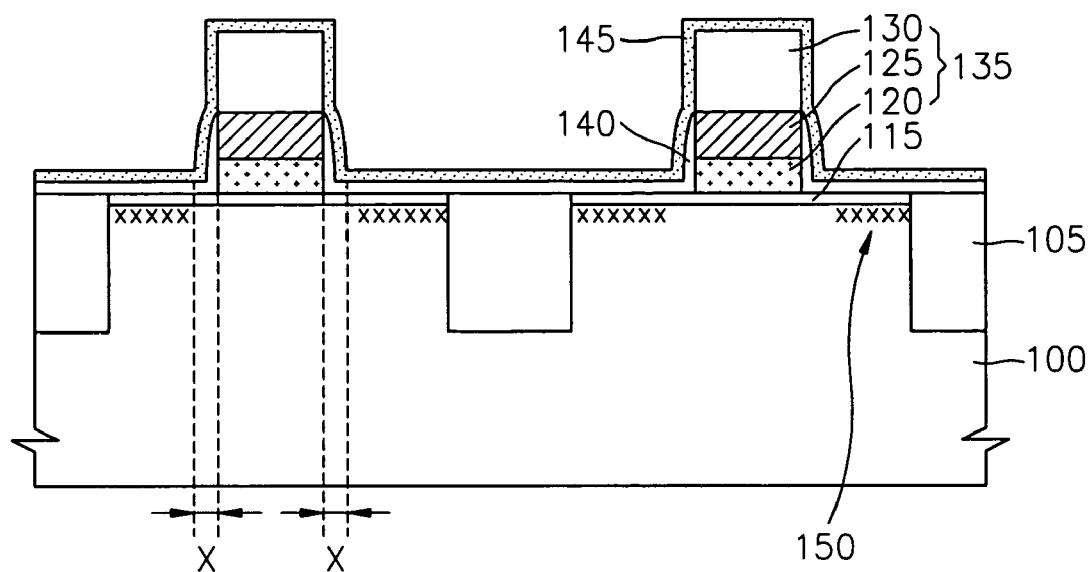

As shown in FIG. 2C, an insulating layer 145, required for preventing short channel, is deposited on the resultant structure, so as to surround the surface of the semiconductor substrate 100 and the gate electrode structure 135. The insulating layer 145 is provided to prevent short channel effects of MOS transistors. For example, a silicon oxide layer can be used as the insulating layer 145. This insulating layer 145 must be conformally formed on the surface of the semiconductor substrate 100 and the sidewalls of the gate electrode structure 135. Also, the insulating layer 145 can be formed by CVD at a temperature of about 720° C. to about 820° C. The insulating layer 145 can be formed to such a thickness that does not affect the depths of ion implantation regions formed by subsequent ion implantation processes, for example, to a thickness of about 50 Å to about 100 Å.

Next, low-concentration impurity ions 150, of which conductivity type is opposite to that of the well formation ions 10a, are implanted into the semiconductor substrate 100. They are implanted on both sides of the gate electrode structure 135, preferably, into the semiconductor substrate 100 outside the insulating layer 145 formed on the sidewalls of the gate electrode structure 135. For example, in a cell transistor (or an NMOS transistor), phosphorus (P) ions, which are n-type impurity ions, are lightly doped at an energy of about 15 KeV to about 25 KeV and at a dose of about $1\times10^{13}$ ions/cm$^2$. In the present embodiment, the low-concentration impurity ions 150 are implanted to be spaced apart from the sidewalls of the gate electrode structure 130 by a predetermined distance, i.e., the sum of the thicknesses of the insulating layer 145 for preventing short channel and the GPOX layer 140. That is, the low-concentration impurity ions 150 do not penetrate the insulating layer 145 for preventing short channel disposed on the sidewalls of the gate electrode structure 135 because it has almost the same thickness as the height of the gate electrode structure 135. Accordingly, the low-concentration impurity ions 150 are implanted into the semiconductor substrate 100 outside the insulating layer 145 disposed on the sidewalls of the gate electrode structure 135.

Also, since the insulating layer 145 for preventing short channel and the GPOX layer 140 are sub-100-Å thin layers, they do not affect the doping depth of the low-concentration impurity ions 150.

Figure 2D:
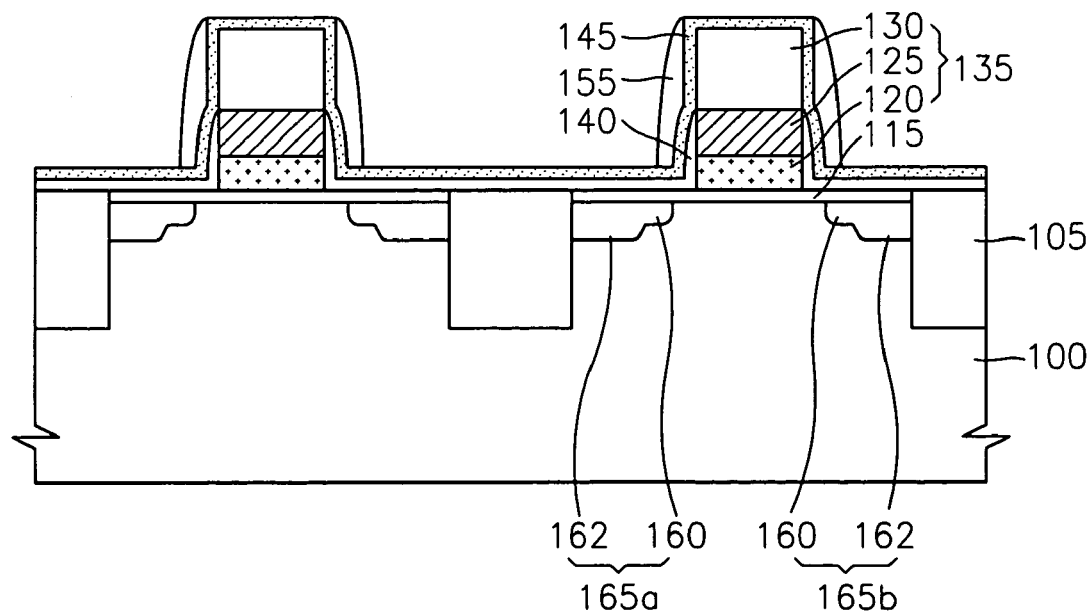

As shown in FIG. 2D, an insulating layer for spacers is deposited on the insulating layer 145. Here, the insulating layer for the spacers may be formed using a silicon nitride layer to a thickness of about 300 Å to about 500 Å. Next, sidewall spacers 155 are formed by etching the insulating layer for the spacers, for example, using an anisotropic etch process, and high-concentration impurity ions are implanted into the semiconductor substrate 100 on both sides of the sidewall spacers 155. For example, phosphorus (P) ions are implanted at an energy of about 15 KeV to about 25 KeV and at a dose of about $1\times10^{15}$ ions/cm$^2$. Next, the resultant structure is thermally treated at a predetermined temperature to activate the impurity ions doped into the substrate 100, thereby forming a source region 165a and a drain region 165b. Each of the source and drain regions 165a and 165b may include a lightly doped region 150a and a heavily doped region 160a. As described above, since the lightly doped region 150a is spaced apart from the sidewalls of the gate electrode structure 135 by a predetermined distance, e.g., by the sum of the thicknesses of the insulating layer 145 and the GPOX layer 140, the channel length of the MOS transistor can increase to be double the sum of the thicknesses of the insulating layer 145 and the GPOX layer 140. Thus, while the line width of the gate electrode structure 135 is based on the design rule, the distance between the source region 165a and the drain region 165b (i.e., the effective channel length) is increased. As a result, short channel effects caused by shortened effective channel length can be prevented, thus improving refresh characteristics.

Although the source region 165a and the drain region 165b are spaced apart from the gate electrode structure 135 by the sum of the thicknesses of the insulating layer 145 and the GPOX layer 140, since both the insulating layer 145 and the GPOX layer 140 are thin layers, when voltage is applied to the gate electrode structure 135, a channel is formed between the source region 165a and the drain region 165b.

Also, the insulating layer 145, which is formed on the resultant structure of the semiconductor substrate 100, can protect the surface of the semiconductor substrate 100 from an etch gas (e.g., plasma) in the anisotropic etch process for forming the sidewall spacers 155, thus preventing damage of the surface of the semiconductor substrate 100.

Also, the hard mask layer 130 formed of nitride and the insulating layer 145 formed of oxide are stacked on top of the doped polysilicon layer 120 and the transition metal silicide layer 125, which constitute a substantial conductive member of the gate electrode structure 135, and the insulating layer 145 formed of oxide and the sidewall spacers 155 formed of nitride are stacked on the lateral surface thereof. That is, the insulating members, which are formed on the top surface and the lateral surface of the doped polysilicon layer 120 and the transition metal silicide layer 125, have an oxide-nitride structure, of which dielectric constant is relatively low. Therefore, even if a self-aligned contact pad (not shown) and a bit line (not shown) are formed on the top surface and the lateral surface of the gate electrode structure 135, parasitic capacitance can be reduced due to the interposed low-k dielectric insulating members. The reduction in parasitic capacitance leads bit line voltage to vary within a larger range, thereby improving refresh characteristics.

As explained thus far, according to an aspect of the present invention, an insulating layer 145 for preventing short channel is conformally deposited to a thickness of about 50 Å to about 100 Å on a semiconductor substrate where a gate electrode structure 135 is formed. Next, low-concentration impurity ions are implanted into the semiconductor substrate 100 on both sides of the gate electrode structure 135, spacers 155 are formed on the sidewalls of the gate electrode structure 135, and then high-concentration impurity ions are implanted to form source and drain regions 165a, 165b. The resultant source and drain regions 165a, 165b are spaced apart from the sidewalls of the gate electrode structure 135 by more than the thickness of the insulating layer 145 for preventing short channel. Thus, the channel length can be increased to be more than the thickness of the insulating layer 145 for preventing short channel.

Also, the effective channel length can be increased by just a single deposition of the insulating layer for preventing short channel. Thus, the manufacture of semiconductor devices is simplified and stress applied to the substrate is minimized.

Also, since the insulating layer 145 for preventing short channel is formed on the surface of the semiconductor substrate 100, the substrate surface can be protected from an etch gas used for forming sidewall spacers 155.

Further, insulating layers 145, which are formed on top and sidewalls of the gate electrode structure 135 (i.e., a doped polysilicon layer and a transition metal silicide layer), have an oxide-nitride structure, of which dielectric constant is relatively low, thus reducing parasitic coupling capacitance.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A semiconductor device comprising:
   a semiconductor substrate;
   a gate insulating layer disposed on the semiconductor substrate;
   a gate electrode structure disposed on a portion of the gate insulating layer;
   an insulating layer for preventing short channel, the insulating layer disposed on the semiconductor substrate and the gate electrode structure, the insulating layer covering a top surface of the gate electrode structure; and
   a source region and a drain region disposed in the semiconductor substrate on either side of the gate electrode structure,
   wherein each of the source region and the drain region is spaced apart from the gate electrode structure by the thickness of the insulating layer, and the insulating layer has a thickness of about 50 Å to about 100 Å.

2. The device of claim 1, wherein the gate electrode structure comprises:
   a doped polysilicon layer disposed on the gate insulating layer;
   a transition metal suicide layer disposed on the doped polysilicon layer; and
   a hard mask layer disposed on the transition metal silicide layer.

3. The device of claim 2, further comprising a gate poly oxide (GPOX) layer interposed between the doped polysilicon layer/the transition metal silicide layer and the insulating layer and between the gate oxide layer and the insulating layer,
   wherein each of the source region and the drain region is spaced apart from the sidewalls of the gate electrode structure by a sum of the thicknesses of the insulating layer and the GPOX layer.

4. The device of claim 1, wherein the insulating layer is a silicon oxide layer.

5. The device of claim 1, further comprising spacers disposed on the surface of the insulating layer, which is disposed on the sidewalls of the gate electrode structure.

6. The device of claim 2, further comprising spacers disposed on the surface of the insulating layer, which is disposed on the sidewalls of the gate electrode structure, wherein the spacers and the hard mask layer are silicon nitride layers.

7. The device of claim 1, wherein each of the source region and the drain region has an LDD structure including a lightly doped region and a heavily doped region.

8. A semiconductor device comprising:
   a semiconductor substrate;
   a gate insulating layer disposed on the semiconductor substrate;
   a gate electrode structure disposed on a portion of the gate insulating layer and including at least one conductive layer;
   a GPOX layer disposed on the sidewalls of the conductive layer of the gate electrode structure and on the surface of the gate insulating layer;
   an insulating layer for preventing short channel covering the gate electrode structure;
   spacers disposed on the surface of the insulating layer, which is disposed on the sidewalls of the gate electrode structure; and
   a source region and a drain region disposed in the semiconductor substrate on either side of the gate electrode structure,
   wherein each of the source region and the drain region is spaced apart from the gate electrode structure by the sum of the thicknesses of the insulating layer and the GPOX layer, and the insulating layer has a thickness of about 50 Å to about 100 Å.

9. A method of manufacturing a semiconductor device, the method comprising:
   forming a gate insulating layer on a semiconductor substrate;
   forming a gate electrode structure on a predetermined portion of the gate insulating layer;
   conformally forming an insulating layer for preventing short channel to a thickness of about 50 Å to about 100 Å on the surface of the semiconductor substrate where the gate electrode structure is formed; and
   forming a source region and a drain region in the semiconductor substrate on sides of the gate electrode structure.

10. The method of claim 9, before the gate insulating layer is formed on the semiconductor substrate, further comprising:
    forming an isolation layer in a portion of the semiconductor substrate;
    implanting well formation ions into a relatively deep portion of the semiconductor substrate; and
    implanting ions for modulating threshold voltage into the surface of the semiconductor substrate.

11. The method of claim 9, wherein the formation of the gate electrode structure comprises:
    depositing a doped polysilicon layer on the gate insulating layer;
    depositing a transition metal silicide layer on the doped polysilicon layer;
    forming a hard mask layer on the transition metal silicide layer; and patterning predetermined portions of the hard mask layer, the transition metal suicide layer, and the doped polysilicon layer.

12. The method of claim 9, further comprising forming a GPOX layer by thermally oxidizing the resultant structure of the semiconductor substrate where the gate electrode structure is formed, between the formation of the gate electrode structure and the formation of the insulating layer.

13. The method of claim 12, wherein the GPOX layer is formed using thermal oxidation at a temperature of about 800° C. to about 900° C.

14. The method of claim 9, wherein the insulating layer can be formed using chemical vapor deposition (CVD) at a temperature of about 720° C. to about 820° C.

15. The method of claim 9, wherein the formation of the source region and the drain region comprises:
  implanting low-concentration impurity ions into the semiconductor substrate on sides of the gate electrode structure;
  forming spacers on the surface of the insulating layer disposed on the sidewalls of the gate electrode structure;
  implanting high-concentration impurity ions into the semiconductor substrate on both sides of the spacers; and
  activating the heavily doped impurity ions and the lightly doped impurity ions.

16. A method of manufacturing a semiconductor device, the method comprising:
  forming a gate insulating layer on a semiconductor substrate
  forming a gate electrode structure on a predetermined portion of the gate insulating layer;
  forming a GPOX layer by thermally oxidizing the surface of the semiconductor substrate including the gate electrode structure;
  conformally forming an insulating layer for preventing short channel to a thickness of about 50 Å to about 100 Å on the surface of the semiconductor substrate where the gate electrode structure is formed;
  implanting low-concentration impurity ions into the semiconductor substrate on sides of the insulating layer disposed on the sidewalls of the gate electrode structure;
  forming spacers on the surface of the insulating layer disposed on the sidewalls of the gate electrode structure;
  implanting high-concentration impurity ions into the semiconductor substrate on sides of the spacers; and
  forming a source region and a drain region by activating the lightly doped impurity ions and the heavily doped impurity ions.

17. A semiconductor device comprising:
  a semiconductor substrate;
  a gate insulating layer disposed on the semiconductor substrate;
  a gate electrode structure disposed on a portion of the gate insulating layer;
  an insulating layer for preventing short channel disposed on the semiconductor substrate and on the gate electrode structure, the insulating layer covering a top surface of the gate electrode structure; and
  a source region and a drain region disposed in the semiconductor substrate on either side of the gate electrode structure and spaced apart from the gate electrode structure by the thickness of the insulating layer.

18. The device of claim 17, wherein the insulating layer has a thickness of about 50 Å to about 100 Å.

19. A semiconductor device comprising:
  a semiconductor substrate having an active region and an isolation region;
  a gate electrode structure disposed on the region;
  an insulating layer for preventing short channel effects, the insulating layer disposed on a surface of the semiconductor substrate and also on a top and sidewalls of the gate electrode structure;
  spacers disposed on a portion of the insulating layer, which is disposed on the sidewalls of the gate electrode structure; and
  a source region and a drain region disposed in the semiconductor substrate on either side of the gate electrode structure,
  wherein each of the source region and the drain region is spaced apart from the gate electrode structure by the thickness of the insulating layer, each of the source region and the drain region has an LDD structure including a lightly doped region and a heavily doped region, and the insulating layer has a thickness of about 50 Å to about 100 Å.

20. The semiconductor device of claim 19, wherein the insulating layer is formed over the isolation region.

21. The semiconductor device of claim 20, wherein the spacers and the hard mask layer comprise silicon nitride.

* * * * *

UNITED STATES PATENT AND TRADEMARK OFFICE
CERTIFICATE OF CORRECTION

PATENT NO. : 7,279,741 B2 Page 1 of 1
APPLICATION NO. : 10/845688
DATED : October 9, 2007
INVENTOR(S) : Chang-Hyun Cho et al.

It is certified that error appears in the above-identified patent and that said Letters Patent is hereby corrected as shown below:

Column 5, line 41, the word "10a" should read --110a--;
Column 7, line 55, the word "suicide" should read --silicide--;
Column 9, line 2, the word "suicide" should read --silicide--.

Signed and Sealed this

Twenty-third Day of September, 2008

JON W. DUDAS
*Director of the United States Patent and Trademark Office*